(12) United States Patent
Tanaka et al.

(10) Patent No.: US 7,813,391 B2
(45) Date of Patent: Oct. 12, 2010

(54) METHOD OF CONTROLLING SEMICONDUCTOR LASER

(75) Inventors: Hirokazu Tanaka, Yamanashi (JP);
Tsutomu Ishikawa, Yamanashi (JP);
Toyotoshi Machida, Yamanashi (JP)

(73) Assignee: Eudyna Devices Inc., Yamanashi (JP)

( * ) Notice: Subject to any disclaimer, the term of this patent is extended or adjusted under 35 U.S.C. 154(b) by 81 days.

(21) Appl. No.: 12/175,872

(22) Filed: Jul. 18, 2008

(65) Prior Publication Data

US 2009/0022186 A1 Jan. 22, 2009

(30) Foreign Application Priority Data

Jul. 20, 2007 (JP) ............... 2007-189340

(51) Int. Cl.
*H01S 3/04* (2006.01)
(52) U.S. Cl. .................. 372/34; 372/20; 372/38.01; 372/96; 372/102
(58) Field of Classification Search .... 372/29.01–38.09
See application file for complete search history.

(56) References Cited

U.S. PATENT DOCUMENTS

| 2002/0075918 A1 | 6/2002 | Crowder |
| 2007/0036188 A1* | 2/2007 | Fujii ............... 372/50.11 |
| 2007/0263694 A1 | 11/2007 | Fujii |

FOREIGN PATENT DOCUMENTS

| CN | 1913261 A | 2/2007 |
| CN | 1992458 A | 7/2007 |
| EP | 1753104 A2 | 2/2007 |
| EP | 1804349 A1 | 7/2007 |
| JP | 9-92934 A | 4/1997 |

OTHER PUBLICATIONS

European Search Report dated Jul. 30, 2009, issued in corresponding European Patent Application No. 08160838.2.
Chinese Office Action dated Sep. 11, 2009, issued in corresponding Chinese Patent Application No. 200810133961.4.

* cited by examiner

*Primary Examiner*—Armando Rodriguez
*Assistant Examiner*—Xnning Niu
(74) *Attorney, Agent, or Firm*—Westerman, Hattori, Daniels & Adrian, LLP

(57) ABSTRACT

A method of controlling a semiconductor laser that has a plurality of wavelength selection portions having a different wavelength property from each other and is mounted on a temperature control device, including: a first step of correcting a temperature of the temperature control device according to a detected output wavelength of the semiconductor laser; and a second step of controlling at least one of the wavelength selection portions so that changing amount differentials between each wavelength property of the plurality of the wavelength selection portions is reduced, the changing amount differential being caused by correcting the temperature of the temperature control device.

8 Claims, 8 Drawing Sheets

FIG. 2

| | INITIAL SETTING VALUE | | | | TARGET VALUE FOR FEEDBACK CONTROL | |
|---|---|---|---|---|---|---|
| Ch | $I_{LD}$[mA] | $I_{SOA}$[mA] | $I_{Heater}$ [mA] | $T_{LD}$ [deg. C] | $Im1$ [mA] | $Im3/Im2$ |
| 1 | 100 | 51.0 | 31.8 | 21.23 | 2.23 | 1.50 |
| 2 | 100 | 49.0 | 32.1 | 30.52 | 2.70 | 1.23 |
| 3 | 100 | 48.5 | 34.2 | 32.54 | 1.85 | 1.45 |
| ⋮ | ⋮ | ⋮ | ⋮ | ⋮ | ⋮ | ⋮ |
| n | 100 | 50.0 | 32.2 | 33.33 | 2.14 | 1.41 |

SG-DBR REGION
REFLECTION
SPECTRUM

SG-DFB REGION
GAIN SPECTRUM

SG-DBR REGION REFLECTION SPECTRUM

SG-DFB REGION GAIN SPECTRUM

FIG. 6A   CORRESPONDING AT λ3
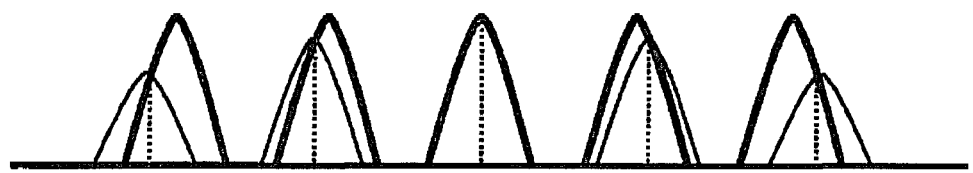
FIG. 6B   AFTER TEMPERATURE CHANGING OF TEC
FIG. 6C
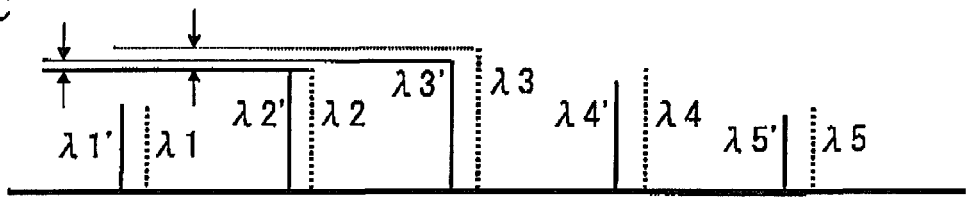

FIG. 8

| Ch | TEMPERATURE CORRECTION COEFFICIENT |
|---|---|
| 1 | $C_1$ |
| 2 | $C_2$ |
| 3 | $C_3$ |
| ⋮ | ⋮ |
| n | $C_n$ |

METHOD OF CONTROLLING SEMICONDUCTOR LASER

BACKGROUND OF THE INVENTION

1. Field of the Invention

The present invention relates a method of controlling a semiconductor laser.

2. Description of the Related Art

A wavelength tunable semiconductor laser is one of optical devices. The wavelength tunable semiconductor laser has a gain for a laser oscillation and selects wavelength. There is a method of tuning wavelength characteristics of loss, reflection or gain by tuning refractive index of an optical functional region such as a diffractive grating provided in an optical waveguide in a resonator, as a method of selecting wavelength.

The method of tuning the refractive index does not need a mechanical movable portion, being different from a method of tuning a mechanical angle or a mechanical length. Therefore, the method has an advantage in reliability and a manufacturing cost. There is a method of tuning a temperature of an optical waveguide, a method of tuning a carrier density in an optical waveguide with current injection or the like, as a method of tuning refractive index of an optical waveguide. There is proposed a semiconductor laser having a Sampled Grating Distributed Bragg Reflector (SG-DBR) in which peak wavelength of reflection peak ranges periodically and a Sampled Grating Distributed Feedback (SG-DFB) in which peak wavelength of gain spectrum ranges periodically, as a concrete example of a wavelength tunable laser adopting a method of tuning a temperature of an optical waveguide.

This semiconductor laser controls a correlation between the reflection spectrums of the SG-DBR and the SG-DFB, selects a wavelength with a venire effect, and emits a laser light. That is, the semiconductor laser oscillates at one of wavelengths where two spectrums are overlapped and reflection intensity gets biggest. It is therefore possible to control the oscillation wavelength by controlling the correlation of two reflection spectrums.

Japanese Patent Application Publication No. 9-92934 (hereinafter referred to as Document 1) discloses a semiconductor laser controlling an oscillation wavelength with a control of refractive index of an optical waveguide. In Document 1, a peltiert device (a temperature control device) and a heater are adopted as a control portion for controlling the refractive index of the optical waveguide. The wavelength is controlled with a control of a temperature control of the optical waveguide with use of the temperature control device and the heater.

However, changing amounts of the two spectrums may differ from each other when the temperature control device controls the temperature of the semiconductor laser. In this case, a desirable oscillation wavelength may not be obtained.

SUMMARY OF THE INVENTION

The present invention has been made in view of the above circumstances and provides a method of controlling a semiconductor laser that may obtain a desirable oscillation wavelength even if the temperature control device controls the semiconductor laser.

According to an aspect of the present invention, there is provided a method of controlling a semiconductor laser that has a plurality of wavelength selection portions having a different wavelength property from each other and is mounted on a temperature control device, including: a first step of correcting a temperature of the temperature control device according to a detected output wavelength of the semiconductor laser; and a second step of controlling at least one of the wavelength selection portions so that changing amount differentials between each wavelength property of the plurality of the wavelength selection portions is reduced, the changing amount differential being caused by correcting the temperature of the temperature control device.

The method solves a problem caused by a changing amount differential of each wavelength property of each wavelength selection portion with respect to the temperature changing of the temperature control device. That is, at least one of the wavelength properties of the wavelength selection portions is changed so that the changing amount differentials between each wavelength property of the plurality of the wavelength selection portions is reduced. Therefore, the wavelength stability of the semiconductor laser may be improved.

BRIEF DESCRIPTION OF THE DRAWINGS

Other objects, features and advantages of the present invention will become more apparent from the following detailed description when read in conjunction with the accompanying drawings, in which:

FIG. 2 illustrates an example of a look-up table;

FIG. 6A through FIG. 6C illustrate a transition of a reflection spectrum at other than the wavelength $\lambda 3$;

FIG. 8 illustrates an example of a heater correction table.

DESCRIPTION OF THE PREFERRED EMBODIMENTS

A description will now be given of embodiments of the present invention with reference to the accompanying drawings.

First Embodiment

Figure 1:
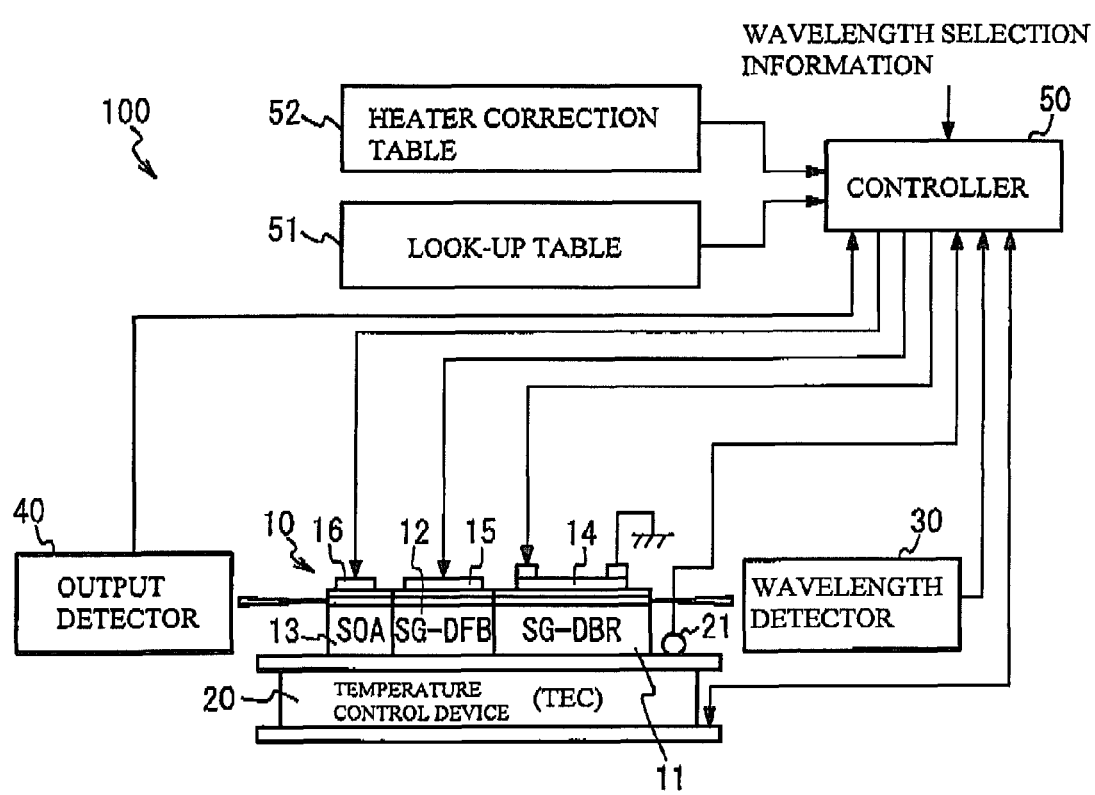
FIG. 1 illustrates a semiconductor laser in accordance with a first embodiment and a structure of a laser device having the semiconductor laser.

FIG. 1 illustrates a semiconductor laser 10 in accordance with a first embodiment and a structure of a laser device 100 having the semiconductor laser 10. As shown in FIG. 1, the laser device 100 has the semiconductor laser 10, a temperature control device 20, a wavelength detector 30, an output detector 40 and a controller 50. The semiconductor laser 10 is mounted on the temperature control device 20. A description will be given of each part.

The semiconductor laser 10 has a structure in which a SG-DBR region 11, a SG-DFB region 12 and a semiconductor amplifier (SOA: Semiconductor Optical Amplifier) region 13 are coupled in order. The SG-DBR region 11 has an optical waveguide in which gratings are provided at a given interval. That is, the optical waveguide of the SG-DBR region 11 has a first region that has a diffractive grating and a second region that is optically connected to the first region and acts as a spacer. The optical waveguide of the SG-DBR region 11 is composed of semiconductor crystalline having an absorption edge wavelength at shorter wavelengths side compared to a laser oscillation wavelength. A heater 14 is provided on the SG-DBR region 11.

The SG-DFB region 12 has an optical waveguide in which gratings are provided at a given interval. That is, the optical waveguide of the SG-DFB region 12 has a first region that has a grating and a second region that is optically connected to the first region and acts as a spacer. The optical waveguide of the SG-DFB region 12 is composed of semiconductor crystalline amplifying a light of a desirable wavelength of a laser oscillation. An electrode 15 is provided on the SG-DFB region 12. The SOA region 13 is composed of semiconductor crystalline for amplifying a light or for absorbing a light with a current control. An electrode 16 is provided on the SOA region 13. The optical waveguides of the SG-DBR region 11, the SG-DFB region 12 and the SOA region 13 are optically connected to each other.

The semiconductor laser 10 is mounted on the temperature control device 20. A thermistor 21 for detecting the temperature of the temperature control device 20 is provided on the temperature control device 20. The wavelength detector 30 has a light receiving element for detecting an intensity of a lasing light and a light receiving element for detecting an intensity of a lasing light that transmits an etalon and has a wavelength property. The output detector 40 has a light receiving element for detecting an intensity of a lasing light passing through the SOA region 13. In FIG. 1, the wavelength detector 30 is arranged on the side of the SG-DBR region 11, and the output detector 40 is arranged on the side of the SOA region 13. However, the structure of the semiconductor laser 10 is not limited. For example, each of the detectors may be arranged in reverse.

The controller 50 has a control portion having a central processing unit (CPU), a random access memory (RAM), a read only memory (ROM) and so on and an electrical power supply. The ROM of the controller 50 stores control information and a control program of the semiconductor laser 10. The control information is, for example, stored in a look-up table 51 and a heater correction table 52. FIG. 2 illustrates an example of the look-up table 51.

As shown in FIG. 2, the look-up table 51 includes an initial setting value and a target value for feedback control. The initial setting value includes an initial current value $I_{LD}$ of the SG-DFB region 12, an initial current value $I_{SOA}$ of the SOA region 13, an initial current value $I_{Heater}$ of the heater 14 and the initial temperature value $T_{LD}$ of the temperature control device 20. The target value for the feedback control includes a target value Im1 for feedback control of the output detector 40 and a target value Im3/Im2 for feedback control of the wavelength detector 30.

Next, a description will be given of an operation of the semiconductor laser 10. The controller 50 refers to the look-up table 51 and obtains the initial current value $I_{LD}$, the initial current value $I_{SOA}$, the initial current value $I_{Heater}$ and the initial temperature value $T_{LD}$.

In concrete, the controller 50 controls the temperature control device 20 so that the temperature of the temperature control device 20 is controlled to be the initial temperature value $T_{LD}$. And the temperature of the semiconductor laser 10 is controlled to be constant near the initial temperature value $T_{LD}$. Consequently the equivalent refractive index of the optical waveguide of the SG-DFB region 12 is controlled to be a given value. Next, the controller 50 provides a current of the initial current value $I_{Heater}$ to the heater 14. Therefore, the equivalent refractive index of the optical waveguide of the SG-DBR region 11 is controlled to be a given value. Next, the controller 50 provides a current of the initial current value $I_{LD}$ to the electrode 15. And a light is generated in the optical waveguide of the SG-DFB region 12. The light generated in the SG-DFB region 12 is repeatedly reflected and amplified in the optical waveguide of the SG-DBR region 11 and the SG-DFB region 12. This results in a laser oscillation. Then, the controller 50 provides a current of the initial current value $I_{SOA}$ to the electrode 16. With the control, the semiconductor laser 10 emits a lasing light at an initial wavelength corresponding to a set channel.

Figure 3A:
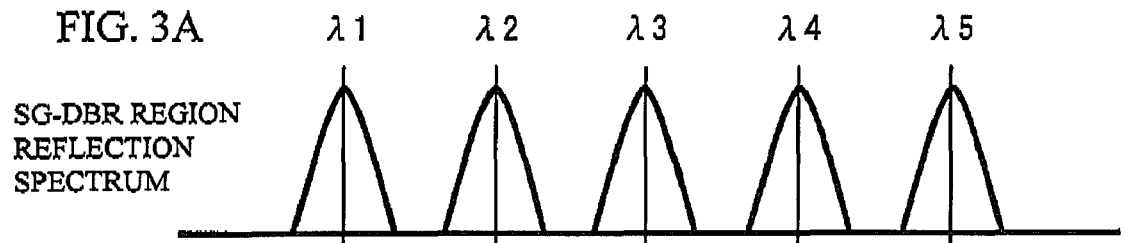
FIG. 3A and FIG. 3B illustrate a principle of a selection of an oscillation wavelength.
Figure 3B:

FIG. 3A and FIG. 3B illustrate a principle of selection of an oscillation wavelength. FIG. 3A illustrates a reflection spectrum in the SG-DBR region 11. FIG. 3B illustrates a gain spectrum in the SG-DFB region 12. A horizontal axis in FIG. 3A and FIG. 3B indicates a wavelength. A vertical axis of FIG. 3A and FIG. 3B indicates a reflectivity and an intensity of the gain.

As shown in FIG. 3A, peak wavelength profiles periodically at a given wavelength interval in the reflection spectrum of the SG-DBR region 11. And as shown in FIG. 3B, peak wavelength profiles periodically at a given wavelength interval in the gain spectrum of the SG-DFB region 12. The gain peak intensity gets lower at a wavelength away from a center wavelength. The reflection spectrum and the gain spectrum are variable according to the temperature of the temperature control device 20 and the heater 14. In a case of FIG. 3A and FIG. 3B, the wavelength λ3, one of the peak wavelengths of the SG-DBR region 11, corresponds to the peak wavelength of the SG-DFB region 12. Therefore, the semiconductor laser 10 oscillates at the wavelength λ3.

Here, a description will be given of a case where the oscillation wavelength is changed for some reasons. In this case, the controller 50 corrects the temperature of the temperature control device 20 so that the detection result ratio Im3/Im2 of two light receiving elements in the wavelength detector 30 is within a given range including the target value Im3/Im2 for the feedback control obtained from the look-up table 51. However, the present inventors have found that correction amount of wavelength property of the SG-DBR region 11 and the SG-DFB region 12 is not always the same.

Figures 4A, 4B:
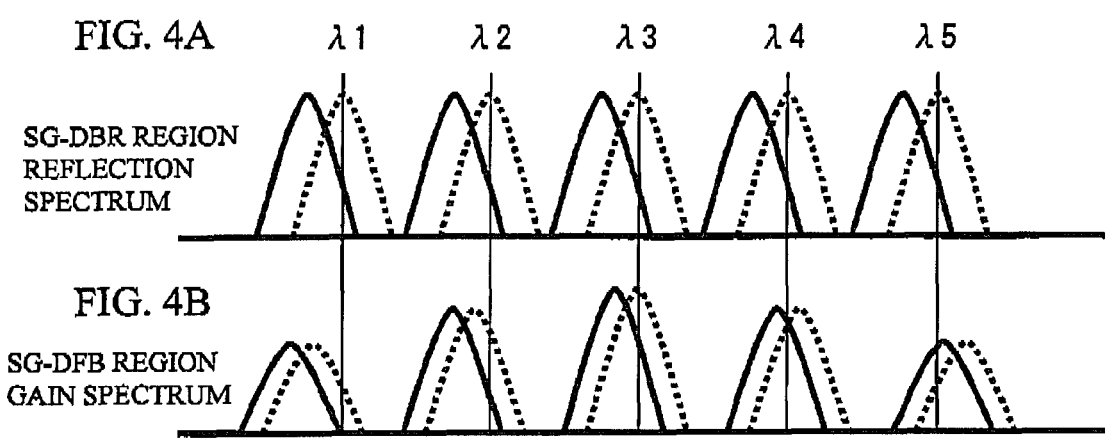
FIG. 4A and FIG. 4B illustrates each wavelength property of a SG-DBR region and a SG-DFB region in a case where temperature of a temperature control device is changed.

FIG. 4A and FIG. 4B illustrate each wavelength property of the SG-DBR region 11 and the SG-DFB region 12 in a case where the temperature of the temperature control device 20 is changed. A dashed line of FIG. 4A and FIG. 4B indicates a reflection spectrum and a gain spectrum in a case where each peak wavelength is overlapped at the wavelength λ3. A solid line of FIG. 4A and FIG. 4B indicates a reflection spectrum and a gain spectrum in a case where the temperature of the temperature control device 20 is changed. FIG. 4A and FIG. 4B illustrate a case where the temperature of the temperature control device 20 is lowered.

As shown in FIG. 4A and FIG. 4D, the changing amount of the reflection spectrum of the SG-DBR region 11 is more than that of the gain spectrum of the SG-DFB region 12. The differential between the changing amounts of the wavelength property with respect to the temperature changing of the temperature control device 20 is not limited to a case of the combination of the SG-DBR region 11 and the SG-DFB region 12. For example, even if two SG-DBR regions are provided as the wavelength selection portion, the changing amounts of the wavelength property with respect to the temperature changing of the temperature control device 20 are different from each other when each wavelength property of the SG-DBR regions is different from each other. This is because the wavelength property of the two SG-DBR regions responses differently with respect to the same temperature changing even if the two SG-DBR regions are subjected to the same temperature changing, because the wavelength property of the two SG-DBR regions are different from each other. That is, there is a problem similar to the above-mentioned case when the semiconductor laser has wavelength selection portions having a different wavelength property, because the changing amounts of the wavelength property is different from each other with respect to the temperature changing of the temperature control device.

In addition, the problem gets larger because of a device structure differential of the wavelength selection portions. For example, a groove is formed on both sides of a heater in order to improve a controllability of the wavelength selection portion with use of the heater, if the heater controls the wavelength selection portion. In this case, thermal conductivity from a temperature control device of a wavelength selection portion not having a groove is different from that of the wavelength selection portion having the groove. This results in an enlargement of the differential of the wavelength property. In FIG. 4A and FIG. 4B, the changing amount of the reflection spectrum in the SG-DBR region 11 is more than that of the gain spectrum in the SG-DFB region. However, the relation may be inverted.

Figure 5:
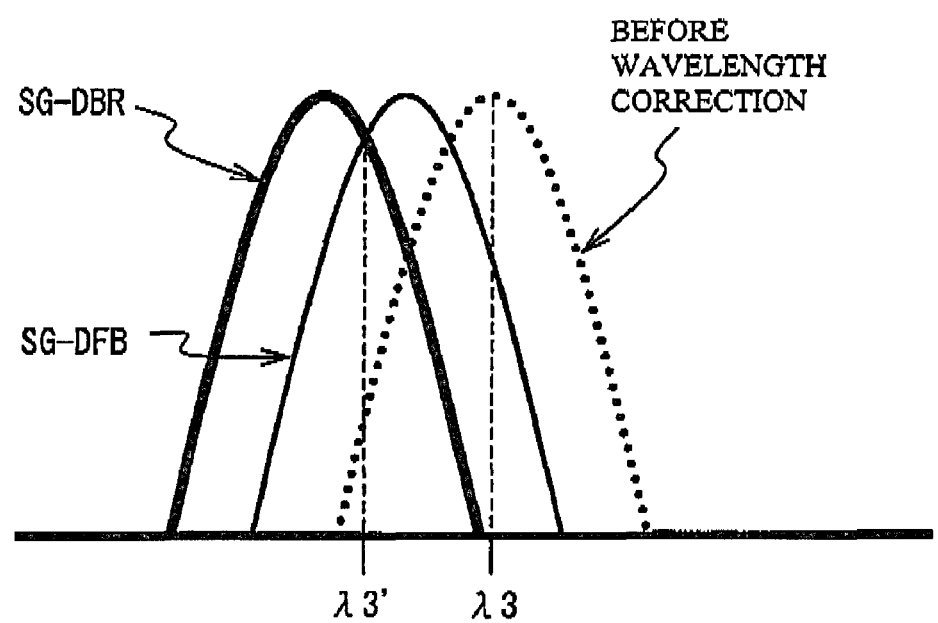
FIG. 5 illustrates an enlarged view of a peak of a SG-DBR region and a SG-DFB region at a wavelength $\lambda 3$.

FIG. 5 illustrates an enlarged view of the peak at the wavelength λ3 of the SG-DBR region 11 and the SG-DFB region 12. In FIG. 5, a dashed line indicates the peak of the SG-DBR region 11 and the SG-DFB region 12 before correction of the temperature of the temperature control device 20. In FIG. 5, it is supposed that a peak profile of the SG-DBR region 11 is the same as that of the SG-DFB region 12, for convenience. In the case of the dashed line, those are overlapped with each other. A solid line indicates the peak of the SG-DFB region 12 after the correction of the temperature of the temperature control device 20. A thick line indicates the peak of the SG-DBR region 11 after the correction of the temperature of the temperature control device 20. These wavelengths differs from each other after the temperature control as shown in FIG. 5, if temperature dependence on the wavelength property is different from each other between the SG-DBR region 11 and the SG-DFB region 12.

In this case, the oscillation wavelength is a wavelength (a wavelength λ3' in FIG. 5) having the largest reflection intensity of the wavelengths where the peak of the SG-DBR region 11 is overlapped with that of the SG-DFB region 12.

There is a problem that the reflection intensity at the wavelength λ3' is lower than the peak intensity of the solid line. FIG. 6A and FIG. 6B illustrate a transition of the reflection intensity at other than the wavelength λ3.

In this case, as shown in FIG. 6C, a reflection intensity differential between at the wavelength λ3' and at the wavelength λ2' after the correction of the temperature is smaller than that between at the wavelength λ3 and at the wavelength λ2 before the correction of the temperature. That is, an oscillation condition at the wavelength λ3' is closer to that at the wavelength λ2' after the correction the temperature. The oscillation wavelength may be the unexpected wavelength λ2' because of the changing of another parameter. The oscillation condition is variable drastically because of a slight differential of the wavelength property of the wavelength selection portions, with the wavelength controlling method in which a venire effect is obtained and a desirable oscillation condition is selected when a plurality of the wavelength selection portions having a different wavelength property are combined.

In the embodiment, the controller 50 corrects the differential between the changing amounts of the reflection spectrum of the SG-DBR region 11 and the gain spectrum of the SG-DFB region 12 caused by the temperature control of the temperature control device 20, with the heat value of the heater 14. A description will be given of details with use of a flowchart.

Figure 7:
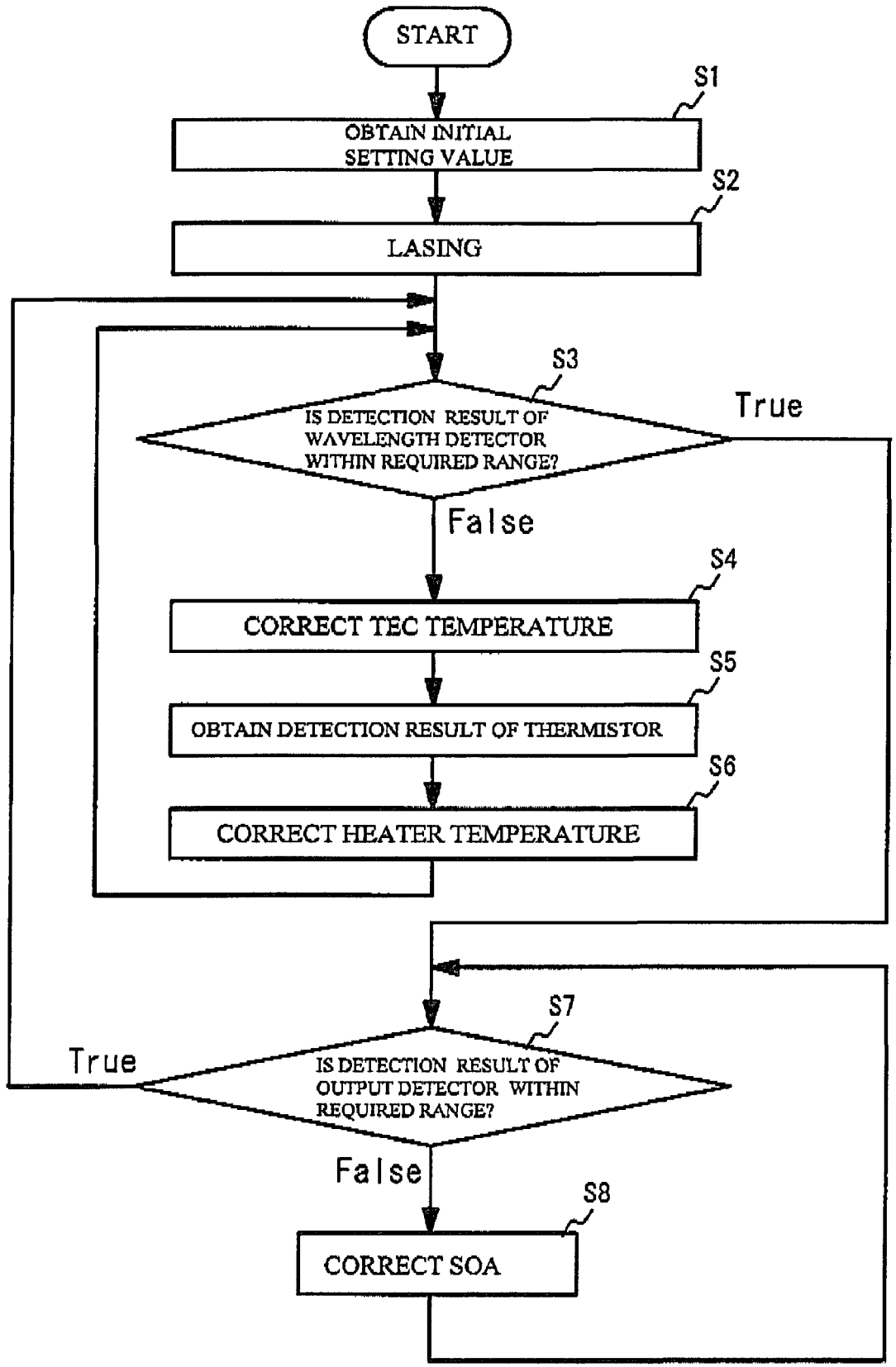
FIG. 7 illustrates a flowchart showing an example of a method of controlling a semiconductor laser.

FIG. 7 illustrates a flowchart showing a controlling method of the semiconductor laser 10. As shown in FIG. 7, the controller 50 refers to the look-up table 51 and obtains the initial current value $I_{LD}$, the initial current value $I_{SO4}$, the initial current value $I_{Heater}$ and the initial temperature value $T_{LD}$ (Step S1).

Next, the controller 50 starts a laser oscillation of the semiconductor laser 10 according to the initial setting value obtained in the Step S1 (Step S2). Next, the controller 50 determines whether the lasing wavelength is within a required range according to the detection result of the wavelength detector 30 (Step S3). If it is not determined that the lasing wavelength is within the required range, the controller 50 corrects the temperature of the temperature control device 20 (Step S4). In this case, the peak wavelength of the gain spectrum in the optical waveguide of the SG-DFB region 12 is changed. Next, the controller 50 obtains the detection result of the thermistor 21 (Step S5).

Then, the controller 50 corrects the temperature of the heater 14 with use of the heater correction table 52 (Step S6). In concrete, the controller 50 monitors the detection result of the thermistor 21 obtained in the Step S6. The controller 50 corrects the temperature of the heater 14 when the detection result is changed. FIG. 8 illustrates the heater correction table 52. As shown in FIG. 8, the heater correction table 52 includes a temperature correction coefficient C at every channel. The temperature correction coefficient C is a coefficient for calculating correction value of the heater 14 with respect to the temperature changing amount of the temperature control device 20. It is possible to obtain a differential between the changing amounts of the wavelength property of the SG-DFB region 12 and the SG-DBR region 11 generated before the temperature transition of the temperature control device 20, in advance. It is therefore possible to obtain a control value of the heat value of the heater 14 that is necessary to reduce the changing amount differential of the wavelength property. In the embodiment, the temperature correction coefficient C is prepared in advance. Each temperature correction coefficient C is prepared individually, because there is a case where the temperature correction value differs according to the channels. The controller 50 calculates a correction value $\Delta I_{Heater}$ of a driving current of the heater 14, when the detection result of the thermistor 21 is changed.

$$\Delta I_{Heater} = C \cdot (T_{LD}' - T_{LD}) \quad \text{[Expression 1]}$$

The temperature correction coefficient C is a coefficient for correcting the heat value of the heater according to the temperature differential between before and after the temperature control. The temperature correction coefficient C is prepared as a current amount in order to correct the driving current of the heater. The $T_{LD}$ is a temperature of the thermistor 21 before detecting temperature changing by the controller 50. The $T_{LD}'$ is a temperature of the thermistor 21 after detecting temperature changing by the controller 50. The calculated $\Delta I_{Heater}$ is added to the driving current of the heater before detecting the temperature changing by the controller 50, and is provided to the heater 14.

After that, the controller 50 executes the Step S3 again. With the loop, the lasing wavelength is feedback controlled to be desirable constant value. If it is determined that the lasing wavelength is within the required range in the Step S3, the controller 50 determines whether an optical intensity of the lasing light is within a required range (Step S7). In concrete, the controller 50 obtains the target value Im1 for feedback control from the look-up table 51, obtains the detection result Im1 from the light receiving element in the output detector 40, and determines whether the detection result Im1 is within a required range including the target value Im1 for feedback control.

If it is not determined that the optical intensity of the lasing light is within the required range in the Step S7, the controller 50 corrects the current to the electrode 16 (Step S8). After that, the controller 50 executes the Step S7 again. With the loop, the optical intensity of the lasing light is feedback controlled to be a desirable constant value. If it is determined that the optical intensity of the lasing light is within the required range in the Step S7, the controller 50 executes the Step S3 again.

With the flowchart in FIG. 7, the peak of the SG-DBR region 11 and the SG-DFB region 12 may be closer to a condition before the temperature control of the temperature control device 20. Therefore, the semiconductor laser 10 may oscillate at the desirable wavelength. The temperature correction coefficient C may be obtained in advance by detecting the temperature changing of the SG-DBR region 11 in a case where the temperature of the temperature control device 20 is changed. The temperature correction value C may be determined according to each channel or may be common with respect to each channel. The heater correction table 52 may include a correction temperature of the heater 14 according to the temperature correction amount of the temperature control device 20.

In the embodiment, the semiconductor laser has the SG-DBR region and the SG-DFB region. However, the structure is not limited. For example, the present invention may be applied to a semiconductor laser in which an active region acting as a gain region is between a pair of SG-DBR regions. In this case, a heater is provided on each of the SG-DBR regions or one of the SG-DBR regions. In this case, it is possible to correct each temperature of the heaters with use of the temperature correction coefficient when the temperature of the temperature control device is changed.

The present invention may be applied to a CSG-DBR (Chirped Sampled Grating Distributed Bragg Reflector). In the CSG-DBR, space regions connecting gratings have a different length from each other, being different from the SG-DBR region. Therefore, there is wavelength dependence in a peak intensity of a reflection spectrum of the CSG-DBR region. In this case, the peak intensity of the reflection spectrum is enlarged in a given wavelength range. It is therefore possible to restrain an oscillation at a wavelength other than a desired wavelength, if a wavelength in a wavelength range having relatively high intensity is used as a lasing wavelength. In a case where the CSG-DBR is used, temperature of each segment having a grating and a spacer may be controllable when heaters are provided separately according to each segment.

In the above-mentioned embodiment, the reflection spectrum of the SG-DBR region is controlled with use of the heater. However, the structure is not limited. The reflection spectrum of the SG-DBR region may be controlled with a current injection to the SG-DBR region. In this case, current injection amount may be corrected when the temperature control device 20 controls the temperature of the SG-DBR region.

In the embodiment, the SG-DFB region 12 corresponds to the active region. The SG-DBR region 11 corresponds to the optical waveguide. The SG-DFB region 12 and the SG-DBR region 11 correspond to the plurality of the wavelength selection portions.

The present invention is not limited to the specifically disclosed embodiments, but include other embodiments and variations without departing from the scope of the present invention.

The present application is based on Japanese Patent Application No. 2007-189340 filed on Jul. 20, 2007, the entire disclosure of which is hereby incorporated by reference.

What is claimed is:

1. A method of controlling a semiconductor laser that has a first wavelength selection portion having a heater and a second wavelength selection portion having a different wavelength property from the first wavelength selection portion, and is mounted on a temperature control device, comprising:
   an initial step of starting a laser oscillation of the semiconductor laser;
   a first step, after the initial step, of correcting a temperature of the temperature control device according to a detection result of a wavelength detector that is a detected output wavelength of the semiconductor laser; and
   a second step, after the first step, of controlling the heater of the first wavelength selection portion so that changes in differentials between the wavelength properties of the first wavelength selection portion and the second wavelength selection portion are reduced, the differentials being caused by temperature corrections brought about by the temperature control device, wherein
   one of the first and second wavelength selection portions has an optical waveguide having a first region that has a diffractive grating, and a second region that is connected to the first region and acts as a spacer, and
   the other of the first and second wavelength selection portions is an active region having another first region that has a diffractive grating and another second region that is connected to the another first region and acts as a spacer.

2. The method as claimed in claim 1, wherein the second step is performed according to a temperature detection result of the temperature control device.

3. The method as claimed in claim 1, wherein the wavelength property of the first and the second wavelength selection portions is at least one of a reflection spectrum or a gain spectrum of the wavelength selection portion.

4. The method as claimed in claim 3, wherein the reflection spectrum or the gain spectrum is peaked periodically at a given interval.

5. The method as claimed in claim 4, wherein the first and the second wavelength selection portions select an oscillation wavelength with use of a vernier effect caused by a combination of the wavelength property.

6. The method as claimed in claim 1, wherein:
   at least one of the first and the second wavelength selection portions has a refractive-index control portion controlling an equivalent refractive-index thereof; and
   the step of reducing the changing amount differential of the wavelength property of the first and the second wavelength selection portions is controlled with a control of the refractive-index control portion.

7. The method as claimed in claim 6, wherein the refractive-index control portion is a heater or a current injecting portion.

8. The method as claimed in claim 1, wherein the second step is performed by calculating a driving current of the heater using a temperature correction coefficient C, the temperature correction coefficient C being a coefficient for correcting a heat value of the heater according to the temperature differential between before and after the temperature control in the first step.

* * * * *